US011644521B1

(12) United States Patent
Hellman et al.

(10) Patent No.: US 11,644,521 B1
(45) Date of Patent: May 9, 2023

(54) CIRCUITRY FOR COMPENSATING FOR GAIN AND/OR PHASE MISMATCH BETWEEN VOLTAGE AND CURRENT MONITORING PATHS

(71) Applicant: Cirrus Logic International Semiconductor Ltd., Edinburgh (GB)

(72) Inventors: Ryan A. Hellman, Austin, TX (US); Viral Parikh, Austin, TX (US); Siddharth Maru, Austin, TX (US); Tejasvi Das, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/690,327

(22) Filed: Mar. 9, 2022

Related U.S. Application Data

(60) Provisional application No. 63/277,339, filed on Nov. 9, 2021.

(51) Int. Cl.
*G01R 27/08* (2006.01)
*G01R 35/00* (2006.01)
(Continued)

(52) U.S. Cl.
CPC ........... *G01R 35/005* (2013.01); *G01R 1/203* (2013.01); *G01R 19/0092* (2013.01);
(Continued)

(58) Field of Classification Search
CPC ...... G01R 35/005; G01R 27/02; G01R 27/14; G01R 1/203; G01R 19/0092; G01R 27/08; G01R 27/16
(Continued)

(56) References Cited

U.S. PATENT DOCUMENTS 5,886,529 A 3/1999 Wakamatsu
2002/0149424 A1 10/2002 Honda
(Continued)

FOREIGN PATENT DOCUMENTS

EP 2270521 A1 1/2011
GB 2246639 A 2/1992

OTHER PUBLICATIONS

International Search Report and Written Opinion of the International Searching Authority, International Application No. PCT/GB2022/052395, dated Dec. 22, 2022.

*Primary Examiner* — Raul J Rios Russo
(74) *Attorney, Agent, or Firm* — Jackson Walker L.L.P.

(57) ABSTRACT

Circuitry comprising: a voltage monitoring path; a current monitoring path; a reference element of a predefined impedance; and processing circuitry, wherein in operation of the circuitry in a calibration mode of operation: the voltage monitoring path is operative to output a signal indicative of a voltage across the reference element in response to a reference signal applied to the reference element; the current monitoring path is operative to output a signal indicative of a current through the reference element in response to the reference signal; and the processing circuitry is operative to: receive the signal indicative of the voltage across the reference element and the signal indicative of the current through the reference element; generate an estimate of an impedance of the reference element; and determine a compensation parameter for an element of the circuitry for compensating for a difference between the estimate of the impedance and the predefined impedance of the reference element.

21 Claims, 5 Drawing Sheets

(51) Int. Cl.
   *G01R 27/02*    (2006.01)
   *G01R 27/14*    (2006.01)
   *G01R 1/20*     (2006.01)
   *G01R 19/00*    (2006.01)
   *G01R 27/16*    (2006.01)

(52) U.S. Cl.
   CPC .............. *G01R 27/02* (2013.01); *G01R 27/14* (2013.01); *G01R 27/08* (2013.01); *G01R 27/16* (2013.01)

(58) Field of Classification Search
   USPC ... 324/76.11–76.83, 459, 600, 649, 691, 705
   See application file for complete search history.

(56) References Cited

U.S. PATENT DOCUMENTS

| | | |
|---|---|---|
| 2015/0168529 A1 | 6/2015 | Reigier et al. |
| 2017/0254871 A1 | 9/2017 | Sestok, IV |
| 2017/0350923 A1 | 12/2017 | Mostert et al. |
| 2018/0252748 A1 | 9/2018 | Wood et al. |
| 2019/0162765 A1* | 5/2019 | Steuer ................ G01R 1/06788 |
| 2021/0083637 A1 | 3/2021 | Valle et al. |
| 2021/0344310 A1 | 11/2021 | Zanbaghi et al. |
| 2022/0244378 A1* | 8/2022 | Lesso ................... G01S 15/931 |
| 2022/0254980 A1* | 8/2022 | Lesso ................... H01L 41/1132 |

* cited by examiner

CIRCUITRY FOR COMPENSATING FOR GAIN AND/OR PHASE MISMATCH BETWEEN VOLTAGE AND CURRENT MONITORING PATHS

FIELD OF THE INVENTION

The present disclosure relates to circuitry comprising voltage and current monitoring paths.

BACKGROUND

Driver circuitry for driving loads such as audio transducers (e.g. speakers) or haptic transducers (e.g. actuators such as linear resonant actuators) often includes voltage detection (VMON) and current detection (IMON) circuit blocks, for detecting, respectively, a voltage across the load and a current through the load while the transducer is being driven by a playback signal such as an audio signal or a haptic waveform. In this context, a playback signal is a drive signal that drives the transducer to generate a desired output such as an audio or haptic output.

The detected voltage and current can be used to calculate, estimate or otherwise determine an impedance of the transducer, which may be a complex impedance having resistive, inductive and capacitive components. The determined impedance may be used in applications such as speaker protection while the playback signal is being provided to the transducer.

FIG. 1 is a schematic diagram showing an example of circuitry that includes voltage and current monitoring paths for monitoring a voltage across a load and a current through the load during operation of the circuitry to drive the load.

The circuitry, which may be implemented as an integrated circuit (IC), is shown generally at 100 in FIG. 1. The circuitry 100 includes driver circuitry 110 configured to receive an input signal and to output a drive signal for driving a load 120 external to the IC.

In some examples the driver circuitry 110 may comprise pulse width modulator (PWM) circuitry and class D amplifier circuitry The load 120, which in this example is represented by a series combination of an inductor and a resistor, may be a transducer such as a speaker, an actuator (e.g. a resonant actuator such as a linear resonant actuator) or the like.

The circuitry 100 includes first and second terminals (e.g. contact pins, pads, balls or the like) 112, 114 for coupling the circuitry 100 to the external load 120. In the illustrated example the first terminal 112 is coupled to the output of the driver circuitry 110 and the second terminal 114 is coupled to a first terminal of a current sense resistor 130, such that when the load 120 is coupled to the first and second terminals 112, 114, the load 120 is coupled in series between the output of the driver circuitry 110 and the current sense resistor 130.

A voltage monitoring path 140 is coupled to the load 120. In the illustrated example the voltage monitoring path 140 comprises analog front end (AFE) circuitry 142 having inputs that are coupled in parallel with the load 120 and an output that is coupled to an input of analog to digital converter (ADC) circuitry 144. For clarity the AFE circuitry 142 is shown in FIG. 1 as having a single output, but it will be appreciated by those skilled in the art that the AFE circuitry 142 could have differential outputs coupled to inputs of the ADC circuitry 144. An output of the ADC circuitry 144 of the voltage monitoring path 140 is coupled to a first input of processing circuitry 150.

The current sense resistor 130 is coupled in series with the load 120 (when the load 120 is coupled to the first and second terminals 112, 114). In the illustrated example the current sense resistor 130 is connected in series between the load 120 and common mode buffer circuitry 160, but it will be appreciated that in some examples the common mode buffer circuitry 160 may be omitted, in which case the current sense resistor 130 may be coupled in series between the load and a ground or 0v supply node or rail.

A current monitoring path 170 is coupled to the current sense resistor 130. In this example the current monitoring path 170 comprises analog front end (AFE) circuitry 172 having inputs that are coupled in parallel with the current sense resistor 130 and an output that is coupled to an input of analog to digital converter (ADC) circuitry 174. Again, for clarity the AFE circuitry 172 is shown in FIG. 1 as having a single output, but it will be appreciated by those skilled in the art that the AFE circuitry 172 could have differential outputs coupled to inputs of the ADC circuitry 174. An output of the ADC circuitry 174 of the current monitoring path 170 is coupled to a second input of the processing circuitry 150.

To estimate the impedance of the load 120, a reference signal of a predefined frequency and amplitude is supplied to the driver circuitry 110 to drive the load 120. The reference signal may be, for example, a sinusoidal voltage waveform of a predefined peak-to-peak amplitude and a predefined frequency, and may be generated by reference signal generator circuitry 180, or alternatively may be a stored signal that is retrieved from memory or the like.

While the load 120 is being driven by the driver circuitry 110 based on the reference signal, the voltage monitoring path 140 outputs a signal (e.g. a voltage) $V_{mon}$ indicative of the voltage across the load 120 to the processing circuitry 150, and the current monitoring path 170 outputs a signal (e.g. a voltage) $I_{mon}$ indicative of the current through the load 120.

The processing circuitry 150 generates an estimate $Z_{est}$ of the impedance of the load 120 based on the signals $V_{mon}$, $I_{mon}$ received from the voltage monitoring path 140 and the current monitoring path 170 respectively. Additionally, the processing circuitry 150 may generate individual estimates for the resistance and reactance of the load 120 using amplitude and phase information from the signals received from the voltage monitoring path 140 and the current monitoring path 170, and these estimates may be provided to downstream circuitry (not shown) for further use and/or processing.

The estimate $Z_{est}$ of the impedance of the load 120 may be used for a wide range of purposes during normal operation of the circuitry 100 to drive the load based on a drive signal output by the driver circuitry 110.

For example, if the load 120 is a linear resonant actuator the estimated impedance $Z_{est}$ may be used, in combination with one or both of the signals $V_{mon}$, $I_{mon}$, for estimating the position of a moving mass of the linear resonant actuator.

Similarly, if the load 120 is a speaker the estimated impedance $Z_{est}$ may be used, in combination with one or both of the signals $V_{mon}$, $I_{mon}$, in a speaker protection system to prevent damage to the speaker by limiting its excursion.

Typically such applications require a high degree of accuracy in the estimated impedance $Z_{est}$.

SUMMARY

According to a first aspect, the invention provides circuitry comprising:
a voltage monitoring path;
a current monitoring path;
a reference element of a predefined impedance; and
processing circuitry,
wherein in operation of the circuitry in a calibration mode of operation:
the voltage monitoring path is operative to output a signal indicative of a voltage across the reference element in response to a reference signal applied to the reference element;
the current monitoring path is operative to output a signal indicative of a current through the reference element in response to the reference signal; and
the processing circuitry is operative to:
receive the signal indicative of the voltage across the reference element and the signal indicative of the current through the reference element;
generate an estimate of an impedance of the reference element; and
determine a compensation parameter for an element of the circuitry for compensating for a difference between the estimate of the impedance and the predefined impedance of the reference element.

The circuitry may be configured to apply the compensation parameter in operation of the circuitry in a load driving mode of operation.

The compensation parameter may be a frequency domain compensation parameter.

The processing circuitry may comprise:
a first conversion block for converting the signal indicative of the voltage across the reference element into a first frequency domain complex vector; and
a second conversion block for converting the signal indicative of the current through the reference element into a second frequency domain complex vector.

The processing circuitry may comprise a calculation block configured to generate the estimate of the impedance of the reference element based on the first and second frequency domain complex vectors and to compare the generated estimate to the predefined impedance of the reference element.

The circuitry may further comprise a compensation block configured to apply the compensation parameter to the first frequency domain complex vector or the second frequency domain complex vector.

The calculation block may be configured to calculate a gain mismatch $\beta$ by dividing a ratio of the magnitude of the first complex vector to the magnitude of the second complex vector by the magnitude of the predefined impedance, and to calculate a phase mismatch $\phi$ by subtracting the phase of a ratio of the first complex vector to the second complex vector from the phase of the predefined impedance.

The calculation block may be configured to calculate a first compensation coefficient $B_R$ and a second compensation coefficient $B_I$, where:

$$B_R = \frac{1}{\beta}\cos\Phi; \text{ and}$$

$$B_I = -\frac{1}{\beta}\sin\Phi,$$

and the compensation parameter may comprise a compensation vector comprising the first and second compensation coefficients.

The compensation parameter may comprise a compensation vector comprising first and second temperature-dependent compensation coefficients.

The calculation block may be configured to select the first and second temperature-dependent compensation coefficients based on a detected temperature.

The temperature-dependent compensation coefficients may comprise predefined polynomials.

The compensation parameter may be a time domain compensation parameter.

The compensation parameter may comprise a parameter of an analog element of the voltage monitoring path or the current monitoring path.

The voltage monitoring path and the current monitoring path may each comprise analog front end (AFE) circuitry and analog to digital converter (ADC) circuitry.

The compensation parameter may comprise a parameter of the AFE circuitry or the ADC circuitry.

The compensation parameter may comprise one or more of:
a resistance of a resistor of filter circuitry of the AFE circuitry of the voltage monitoring path or the current monitoring path;
a capacitance of a capacitor of filter circuitry of the AFE circuitry of the voltage monitoring path or the current monitoring path; and
a transconductance of amplifier circuitry of the AFE circuitry of the voltage monitoring path or the current monitoring path.

The compensation parameter may comprise one or more of:
a resistance of a resistor of a feedback network of amplifier circuitry of the AFE circuitry of the voltage monitoring path or the current monitoring path; and
a reference voltage for the ADC circuitry of the voltage monitoring path or the current monitoring path.

The circuitry may be configured to apply the compensation parameter in operation of the circuitry in the compensation mode of operation.

The processing circuitry may be operative to:
with the compensation parameter applied, generate an estimate of an impedance of the reference element; and
compare the estimate of the impedance and the predefined impedance of the reference element.

The reference element may comprise a tantalum nitride resistor.

The circuitry may further comprise load selector circuitry for selectively coupling the voltage and current monitoring paths to the reference element or to a load according to the mode of operation of the circuitry.

The load selector circuitry may comprise a controllable switch network.

The current monitoring path may comprises a plurality of selectable current sense resistors.

In the calibration mode, the processing circuitry may be operative to determine a first compensation parameter with a first one of the plurality selectable current sense resistors selected In a load driving mode of operation of the circuitry, the processing circuitry may be operable to:
generate a first estimate of an impedance of a load coupled to the circuitry with the first one of the plurality selectable current sense resistors selected; and determine a second compensation parameter if a second estimate of the impedance of the load generated by the processing circuitry with a second one of the of the plurality of selectable current sense resistors selected differs from the first estimate of the impedance of the load.

According to a second aspect, the invention provides an integrated circuit comprising circuitry according to the first aspect.

According to a third aspect, the invention provides a host device comprising circuitry according to the first aspect, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

BRIEF DESCRIPTION OF THE DRAWINGS

Embodiments of the invention will now be described, strictly by way of example only, with reference to the accompanying drawings, of which.

DETAILED DESCRIPTION

Figure 1:
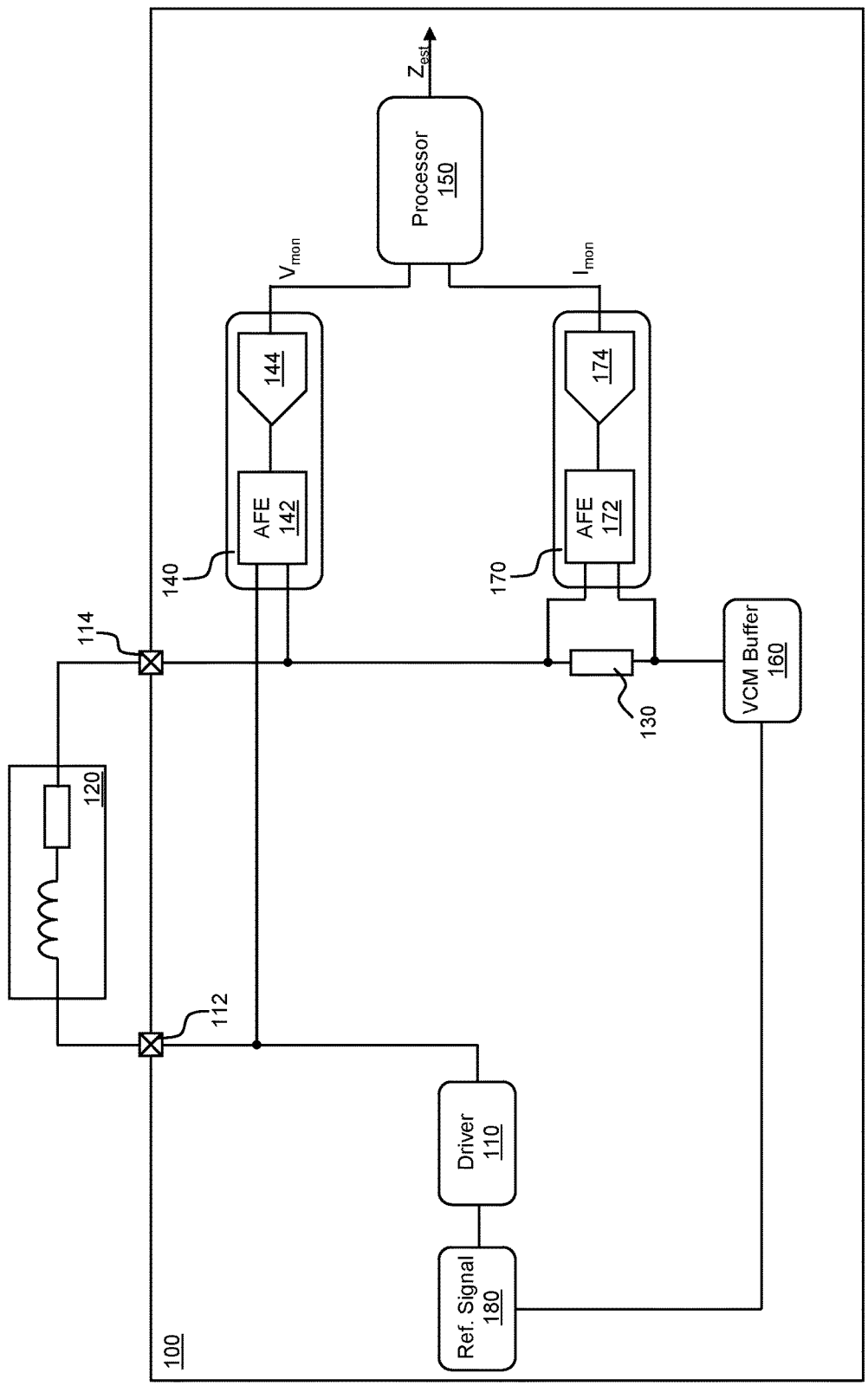
FIG. 1 is a schematic representation of circuitry including voltage and current monitoring paths.

In circuitry of the kind described above with reference to FIG. 1, an estimate $Z_{est}$ of the impedance of the load 120 can be generated by the processing circuitry 150, e.g. by dividing a value of, or representing, the signal $V_{mon}$ output by the voltage monitoring path 140 by a value of, or representing, the signal $I_{mon}$ output by the current monitoring path 170. An estimate of the resistance of the load at a given frequency 120 can be generated (e.g., by the processing circuitry 150) by taking the real part of the result of this division, i.e., $Re(V_{mon}/I_{mon})$ and an estimate of the inductance of the load at a given frequency 120 can be generated (e.g., by the processing circuitry 150) by taking the imaginary part of the result of this division, i.e., $Im(V_{mon}/I_{mon})$.

The voltage monitoring path 140 may apply a gain to the signal received at the inputs of its AFE 142, such that the digital signal $V_{mon}$ output by the voltage monitoring path 140 is a scaled digital representation of the voltage across the load 120. Similarly, the current monitoring path 170 may apply a gain to the signal received at the inputs of its AFE 172, such that the digital signal $I_{mon}$ output by the current monitoring path 170 is a scaled digital representation of the current through the load 120.

If the gain applied by the voltage monitoring path 140 differs from the gain applied by the current monitoring path 170 (i.e., if there is a gain mismatch between the two paths), the accuracy of the estimate $Z_{est}$ of the load impedance, and the accuracy of the estimates of the load resistance and load inductance will be adversely affected, because of the different scaling applied to the voltage across the load 120 and the current through the load 120 as a result of the gain mismatch between the voltage monitoring path 140 and the current monitoring path 170.

Similarly, if a phase shift imparted by the voltage monitoring path 140 differs from a phase shift imparted by the current monitoring path 170, the accuracy of the estimates of the load resistance and load inductance will be adversely affected.

Thus, to generate accurate estimates of the load impedance, load resistance and load inductance, it is necessary to compensate for any gain and/or phase mismatch between the voltage monitoring path 140 and the current monitoring path 170 of the circuitry 100.

Figure 2:
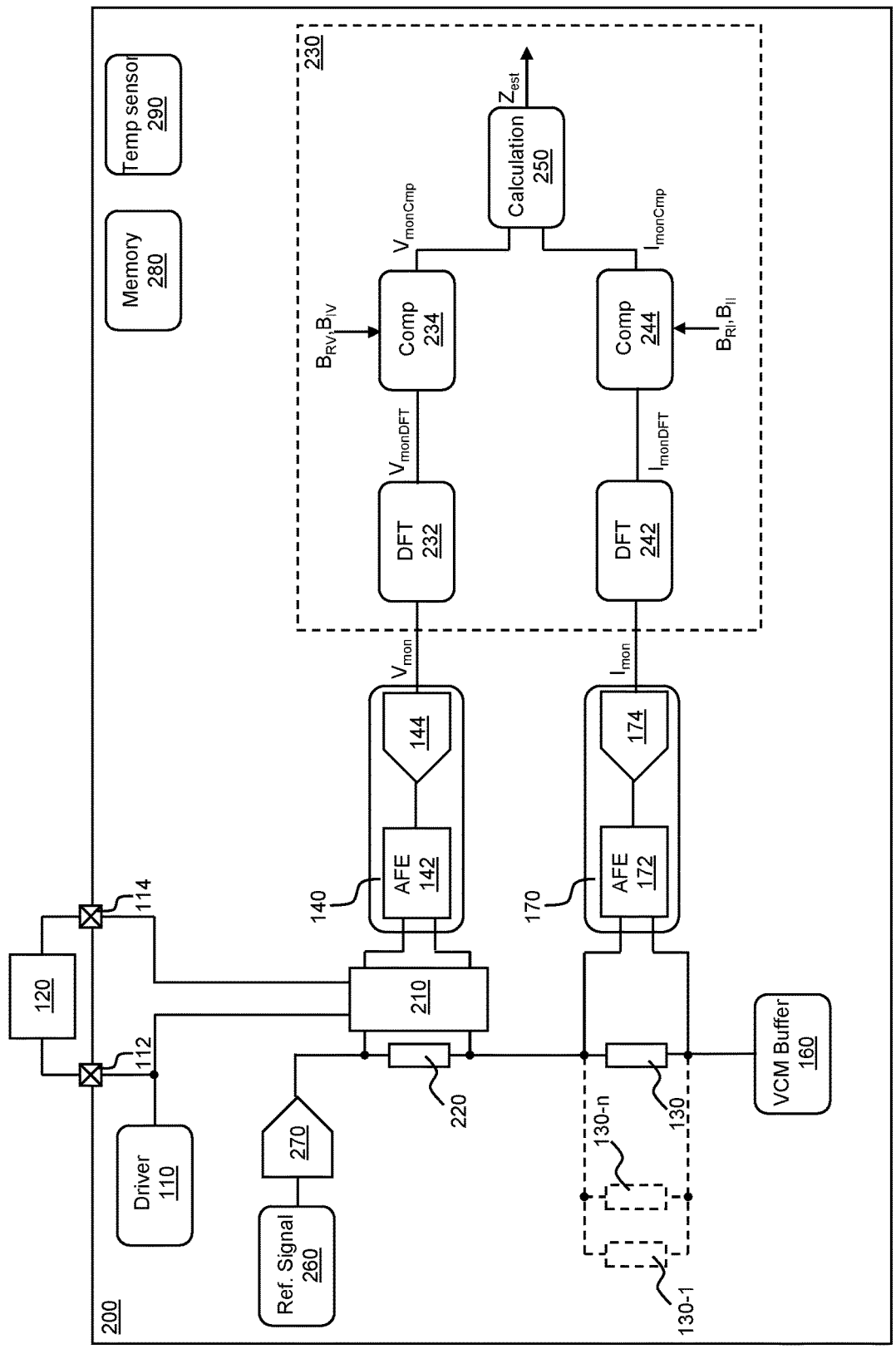
FIG. 2 is a schematic representation of circuitry including voltage and current monitoring paths and compensation circuitry for compensating for gain and/or phase mismatch between the voltage and current monitoring paths.

FIG. 2 is a schematic representation of circuitry including voltage and current monitoring paths and compensation circuitry for compensating for gain and/or phase mismatch between the voltage and current monitoring paths.

The circuitry, shown generally at 200 in FIG. 2, shares some elements in common with the driver circuitry 100 of FIG. 1, and such common elements are denoted by common reference numerals in FIGS. 1 and 2, and will not be described again in detail here. The circuitry 200 may be implemented as an integrated circuit (IC), for example.

The circuitry 200 is operable in a calibration mode and a load driving mode. In the calibration mode the circuitry 200 is operable to measure or otherwise quantify a gain and/or a phase mismatch between a voltage monitoring path 130 and a current monitoring path 170, and to compensate for any such gain and/or phase mismatch. In the load driving mode the circuitry 200 is operable to drive an external load 120 (e.g. a transducer such as a speaker or an actuator) with a drive signal, and to monitor the voltage across the load 120 and the current through the load 120.

Thus the circuitry 200 includes driver circuitry 110 of the kind described above with reference to FIG. 1, configured to supply a drive signal to the load 120 during operation of the circuitry 200 in the load driving mode. The circuitry 200 further includes a voltage monitoring path 140, a current sense resistor 130 and a current monitoring path 170 of the kind described above with reference to FIG. 1.

The circuitry 200 includes load selector circuitry 210 for selectively coupling either the first and second terminals 112, 114 (and hence the external load 120) or a reference element 220 of a predetermined known impedance to the voltage monitoring path 140 and the current sense resistor 130. The load selector circuitry 210 may comprise, for example, a controllable switch network comprising switches that can be opened or closed to couple either the first and second terminals 112, 114 or the reference element 210 to the voltage monitoring path 140 and the current sense resistor 130. Those skilled in the art will readily understand how to implement suitable load selector circuitry 210.

The reference element 220 may have a small temperature coefficient, such that its impedance changes little with temperature, and may have high stability, such that its impedance changes little over time. In some examples the reference element 220 may be, for example, a tantalum nitride resistor, which may be integrated into an IC with the other elements of the compensation circuitry 200.

An output of the ADC circuitry 144 of the voltage monitoring path 140 is coupled to a first input of processing circuitry 230, such that in use of the circuitry 200 during its calibration mode of operation, the voltage monitoring path 140 is configured to output a digital signal $V_{mon}$ indicative of the voltage across the reference element 220 to the processing circuitry 230. During operation of the circuitry 200 in its load driving mode the voltage monitoring path 140 is configured to output a digital signal output a digital signal $V_{mon}$ indicative of the voltage across the load 120 to the processing circuitry 230.

An output of the ADC circuitry 174 of the current monitoring path 170 is coupled to a second input of the processing circuitry 230, such that in use of the circuitry 200 during its calibration mode of operation, the current monitoring path 170 is configured to output a digital signal $I_{mon}$ indicative of the current through the reference element 220 to the processing circuitry 230. During operation of the circuitry 200 in its load driving mode the current monitoring path 170 is configured to output a digital signal output a digital signal $I_{mon}$ indicative of the current through the load 120 to the processing circuitry 230.

The processing circuitry 230 includes a first discrete Fourier transform (DFT) block 232, having an input that is coupled to an output of the voltage monitoring path 140, and a first amplitude/phase compensation block 234 having an input that is coupled to an output of the first DFT block 232. An output of the first amplitude/phase compensation block 234 is coupled to a first input of a calculation block 250.

The processing circuitry 230 further includes a second DFT block 242, having an input that is coupled to an output of the current monitoring path 170, and a second amplitude/phase compensation block 244 having an input that is coupled to an output of the second DFT block 242. An output of the second amplitude/phase compensation block 234 is coupled to a second input of the calculation block 250.

The compensation circuitry 200 further includes reference signal generator circuitry 260, which in this example is configured to generate a digital reference signal. An output of the reference signal generator circuitry 260 is coupled to an input of digital to analog converter (DAC) circuitry 270, which is configured to convert the digital reference signal into an analog reference signal. An output of the DAC circuitry 270 is coupled to a first terminal of the reference element 220, such that the DAC circuitry 270 supplies the analog reference signal to the reference element 220. It will be appreciated by those skilled in the art that the digital reference signal generator circuitry 250 and the DAC circuitry 270 could be replaced, in other examples, with analog reference signal generator circuitry.

In operation of the circuitry 200 in its calibration mode, the load selector circuitry 210 couples the reference element 220 to the voltage monitoring path 140 and the current sense resistor 130. The reference signal generator circuitry 260 generates a digital reference signal (e.g. a digital representation of a sinusoid) of known amplitude and frequency, which is converted into an analog reference signal by the DAC circuitry 270 and applied to the reference element 220.

A digital signal $V_{mon}$ representing a voltage across the reference element 220 as a result of the applied reference signal is generated by the voltage monitoring path 140 and output to the first DFT block 232. The first DFT block 232 converts the digital time domain signal $V_{mon}$ into a frequency domain signal $V_{monDFT}$, which is output to the first amplitude/phase compensation block 234.

Similarly, a digital signal $I_{mon}$ representing a current through the reference element 220 as a result of the applied reference signal is generated by the current monitoring path 170 and output to the second DFT block 242. The second DFT block 242 converts the digital time domain signal $I_{mon}$ into a frequency domain signal $I_{monDFT}$, which is output to the second amplitude/phase compensation block 244.

The calculation block 250 receives the frequency domain signals $V_{monDFT}$, $I_{monDFT}$ output by the first and second amplitude/phase compensation blocks 234, 244 and, based on these received signals, calculates an estimate $Z_{est}$ of the impedance of the reference element 220. The calculation block 250 then compares this estimate of the impedance of the reference element 220 to the predefined impedance $Z_{known}$ of the reference element 220. If the calculated estimate of the impedance is equal to the predefined impedance (or is within a defined tolerance range around the predefined impedance), the calculation block 250 may determine that there is no gain or phase mismatch between the voltage monitoring path 140 and the current monitoring path 170 and thus that no compensation is required.

On the other hand, if the calculated estimate of the impedance is not equal to the predefined impedance (or is not within a defined tolerance range around the predefined impedance), the calculation block 250 may determine that there is a gain and/or a phase mismatch between the voltage monitoring path 140 and the current monitoring path 170 and thus that compensation is required.

To compensate for the gain and/or phase mismatch the calculation block 250 determines, during operation of the circuitry 200 in its calibration mode, compensation coefficients to be applied by the first and/or the second gain and phase compensation blocks 234, 244 during operation of the circuitry 200 in its load driving mode.

As noted above, the first DFT block 232 generates a frequency domain representation $V_{monDFT}$ of the digital time domain signal $V_{mon}$. In this example the first DFT block 232 generates a first complex vector $V_{monDFT}=Vr+jVi$ representing the digital time domain signal $V_{mon}$ output by the voltage monitoring path 140. Similarly, the second DFT block 242 in this example generates a second complex vector $I_{monDFT}=Ir+jIi$ representing the digital time domain signal $I_{mon}$ output by the current monitoring path 170.

The calculation block 250 calculates a complex impedance vector for the reference element 220 based on the first and second complex vectors $Vr+jVi$, $Ir+jIi$ output by the first and second DFT blocks 232, 242 respectively by dividing the first complex vector $Vr+jVi$ by the second complex vector $Ir+jIi$, i.e.

$$Z_{est}=(Vr+jVi)/(Ir+jIi) \qquad (1)$$

If there is no gain or phase mismatch, the estimated impedance $Z_{est}$ is equal to (or is within a defined tolerance range of) the predefined impedance $Z_{known}$. If the estimated impedance $Z_{est}$ is not equal to (or is outside a defined tolerance range of) the predefined impedance $Z_{known}$ then a gain or phase mismatch exists between the voltage monitoring path 140 and the current monitoring path 170.

A gain mismatch $\beta$ can be defined as a ratio of the amplitude of the signal $V_{mon}$ to the amplitude of the signal $I_{mon}$ when the signals input to the AFE 142 of the voltage monitoring path 140 and to the AFE 172 of the current monitoring path 170 are identical. The gain mismatch $\beta$ can be directly calculated by the calculation block 250 from the first and second complex vectors $Vr+jVi$, $Ir+jIi$ output by the first and second DFT blocks respectively, by dividing a ratio of the magnitude of the first complex vector to the magnitude of the second complex vector by the magnitude of the predefined impedance $Z_{known}$, i.e.:

$$\beta=(|Vr+jVi|/|Ir+jIi|)/|Z_{known}| \qquad (2)$$

A phase mismatch ϕ can be defined as a difference between the phase of the signal $V_{mon}$ and the phase of the signal $I_{mon}$. The phase mismatch ϕ can be directly calculated by the calculation block 250 from the first and second complex vectors Vr+jVi, Ir+jIi output by the first and second DFT blocks respectively, by subtracting the phase of a ratio of the first complex vector to the second complex vector from the phase of the predefined impedance $Z_{known}$, i.e:

$$\phi = \phi_{Zknown} - (Vr+jVi)/(Ir+jIi) \quad (3)$$

Thus, if a gain and/or phase mismatch exists between the voltage monitoring path 140 and the current monitoring path 170, then the time domain signal $V_{mon}$ can be represented in the frequency domain as a vector product of the first complex vector Vr+jVi (representing the signal in the absence of any gain or phase mismatch) and a mismatch vector α cos ϕ+jβ sin ϕ representing any gain mismatch β and any phase mismatch ϕ, i.e.

$$V_{monDFT} = (Vr+jVi)(\beta \cos\phi + j\beta \sin\phi) \quad (4)$$

The complex impedance estimate output by the calculation block 250 would thus be $$Z_{est} = ((Vr+jVi)(\beta \cos\phi + j\beta \sin\phi))/(Ir+jIi)$$

In order to compensate for the gain and/or phase mismatch, the (β cos ϕ−jβ sin ϕ) term in $Z_{est}$ must be cancelled.

Compensation coefficients $B_R$ and $B_I$ can be calculated by the calculation block 150 as follows:

$$B_R = \frac{1}{\beta}\cos\Phi$$

$$B_I = -\frac{1}{\beta}\sin\Phi$$

These compensation coefficients can then be applied to the complex vector $V_{monDFT}$ output by the first DFT block 232 by the first amplitude/phase compensation block 234 to generate a compensated complex vector $V_{moncmp}$ in which any gain and/or phase mismatch is compensated, by multiplying the complex vector $V_{monDFT}$ by a compensation vector $$B_{RV} + jB_{IV} = \frac{1}{\beta}\cos\Phi - j\frac{1}{\beta}\sin\Phi.$$

Thus:

$$V_{moncmp} = (Vr+jVi)(\beta\cos\Phi + j\beta\sin\Phi)\left(\frac{1}{\beta}\cos\Phi - j\frac{1}{\beta}\sin\Phi\right) = Vr+jVi$$

The compensation coefficients $B_{RV}$ and $B_{IV}$ calculated by the calculation block 150 during operation of the circuitry 200 in its calibration mode can be stored and applied, by the first amplitude/phase compensation block, to the complex vector $V_{monDFT}$ generated and output by the first DFT block 232 during operation of the circuitry 200 in its load driving mode to compensate for any gain and/or phase mismatch between the voltage monitoring path 140 and the current monitoring path 170.

As will be appreciated by those of ordinary skill in the art, applying the compensation vector $B_{RV}+jB_{IV}$ to the complex vector $V_{monDFT}$ has the effect of rotating the vector $V_{monDFT}$ to compensate for the gain and/or phase mismatch. Thus the first amplitude/phase compensation block 234 may be said to perform vector rotation on the vector $V_{monDFT}$.

This vector rotation operation improves the accuracy of the estimate $Z_{est}$ of the load impedance and the accuracy of any estimate of the resistance and/or inductance of the load 120 generated by the calculation block 250 during operation of the circuitry 200 in its load driving mode.

The compensation coefficients $B_{RV}$ and $B_{IV}$ described above are applied by the first amplitude/phase compensation block 234 to the frequency domain representation of the signal output by the voltage monitoring path 140. As will be appreciated by those of ordinary skill in the art, compensation coefficients $B_{RI}$ and $B_{II}$ to be applied by the second amplitude/phase compensation block 244 to the frequency domain representation of the signal output by the current monitoring path 170 could be generated by the calculation block 250 using a process similar to that described above. Such compensation coefficients $B_{RI}$ and $B_{II}$ could be applied instead of or in addition to the compensation coefficients $B_{RV}$ and $B_{IV}$ during operation of the circuitry 200 in its load driving mode to perform vector rotation of the vector $I_{monDFT}$.

In some cases the gain and/or phase mismatch between the voltage monitoring path 140 and the current monitoring path 170 may vary with temperature. Thus, temperature-dependent compensation coefficients may be defined:

$$B_R(T) = \frac{1}{\beta(T)}\cos(\Phi(T))$$

$$B_I(T) = -\frac{1}{\beta(T)}\sin(\Phi(T))$$

These temperature-dependent compensation coefficients may be approximated with Nth order polynomials of the form:

$$B_R(T) \approx b_{r0} + b_{r1}(T-25) + b_{r2}(T-25)^2 + \ldots b_{rN}(t-25)^N$$

$$B_I(T) \approx b_{i0} + b_{i1}(T-25) + b_{i2}(T-25)^2 + \ldots b_{iN}(t-25)^N$$

The temperature-dependent compensation coefficients may be predefined and stored, e.g. in a memory 280 that forms part of the circuitry 200 or a host device incorporating the circuitry 200. The appropriate temperature-dependent compensation coefficient for the prevailing temperature T (as detected, for example, by a temperature sensor 290 that forms part of the circuitry 200 or a host device incorporating the circuitry 200) may then be selected retrieved by the calculation block 250 and used to determine or generate the compensation parameter (i.e. the compensation vector) to be applied by the first and/or second amplitude/phase compensation blocks 234, 244 to compensate for a detected gain and/or phase mismatch.

In the circuitry 200 of FIG. 2, gain and or/phase mismatch compensation is performed digitally in the frequency domain, by determining, during operation of the circuitry 200 in its calibration mode, one or more compensation parameters (which in this example are the compensation coefficients $B_{RV}$ and $B_{IV}$ and/or $B_{RI}$ and $B_{II}$) for compensating for a difference between the estimated impedance $Z_{est}$ and the predefined impedance $Z_{known}$ of the reference load 220, and applying the determined compensation parameter(s) during operation of the circuitry 200 in its load driving mode.

In other examples gain and/or phase mismatch compensation may be performed in the time domain.

Figure 3:
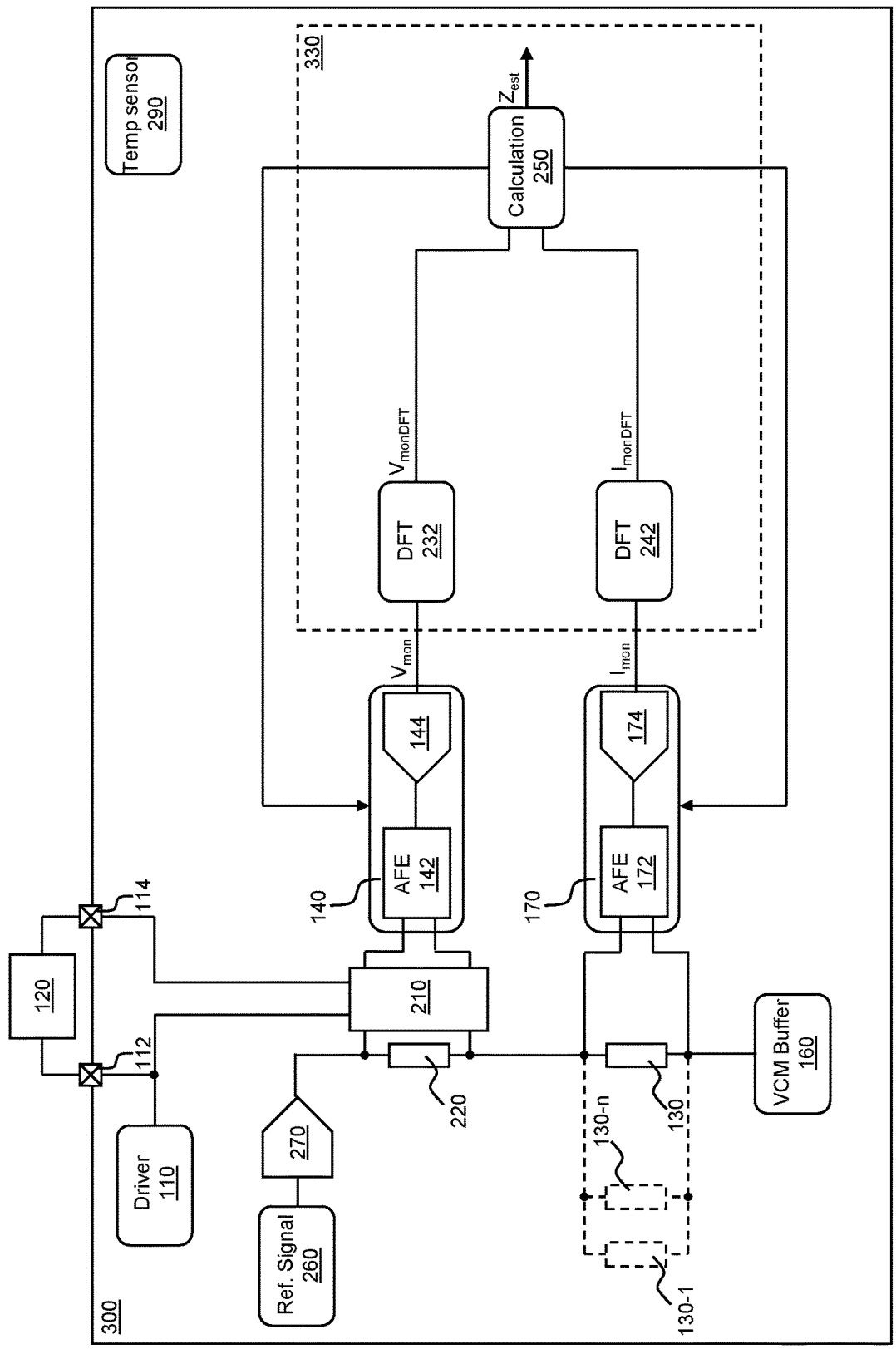
FIG. 3 is a schematic representation of circuitry including voltage and current monitoring paths and alternative compensation circuitry for compensating for gain and/or phase mismatch between the voltage and current monitoring paths.

FIG. 3 is a schematic representation of circuitry including voltage and current monitoring paths and alternative compensation circuitry for compensating for gain and/or phase mismatch between the voltage and current monitoring paths.

The circuitry, shown generally at 300 in FIG. 3, shares some elements in common with the driver circuitry 200 of FIG. 2, and such common elements are denoted by common reference numerals in FIGS. 2 and 3, and will not be described again in detail here. The circuitry 300 may be implemented as an integrated circuit (IC), for example.

The circuitry 300 differs from the circuitry 200 in that its compensation circuitry 330 does not include first and second amplitude/phase compensation blocks. Instead, the outputs of the first and second DFT blocks 232, 242 are coupled directly to inputs of the calculation block 250.

The calculation block 250 is configured to determine, based on a difference between the estimated impedance $Z_{est}$ of the reference load 220 (which is determined based on the signals $V_{monDFT}$ and $I_{monDFT}$ output by the first and second DFT blocks 232, 242 as described above) and the predefined impedance $Z_{known}$ of the reference load 220, one or more compensation parameters to be applied to analog elements of the voltage monitoring path 130 and/or the current monitoring path 170.

The analog front end (AFE) circuitry 142, 172 of the voltage and current monitoring paths 140, 170 may include filter circuitry for attenuating out-of-band components. For example, in audio applications where the load 120 is a speaker, the AFE circuitry 142, 172 may include filter circuitry for attenuating components of the drive signal output by the driver circuitry 110 that are outside of the audio frequency range, e.g. components above 20 kHz. The filter circuitry in the AFE circuitry 142, 172 may also act as an anti-aliasing filter for the ADC circuitry 144, 172.

In some examples, the circuitry 200, 300 may include one or more additional current sense resistors, e.g., additional current sense resistors 130-1, 130-$n$ (shown in dashed outline in FIGS. 2 and 3) that can be selectively coupled to the current monitoring path 170 in place of or in addition to the current sense resistor 130 (e.g., by means of suitable switches) for use in different applications of the circuitry 200, 300 and/or with different loads 120. Thus, for example, a first one 130-1 of the additional current sense resistors may be selected and coupled to the current monitoring path 170 in place of the current sense resistor 130 when a first load 120 (e.g., a speaker) is coupled to the circuitry 200, 300, and a different one 130-$n$ of the additional current sense resistors may be selected and coupled to the current monitoring path 170 when a different load 120 is coupled to the circuitry 200, 300.

In some situations, one of the additional current sense resistors 130-1, 130-$n$ may be selected in place of (or in addition to) the current sense resistor 130 after calibration of the circuitry 200, 300 using the reference element 220 as described above, and after a first estimate of the the impedance of the load 120 has been determined by the calculation block 250 during operation of the circuitry 200, 300 in its load driving mode.

Any difference between first estimate of the impedance of the load 120 and a second estimate of the impedance of the same load 120 subsequently calculated by the calculation block 250 during operation of the circuitry 200, 300 in its load driving mode would be due to a gain error introduced by the selected additional current sense resistor 130-1, 130-$n$. To compensate for any such gain error, the circuitry 200, 300 could perform an on the fly calibration operation with the load 120 in the manner described above, to compensate for any gain or phase mismatch that may have been introduced as a result of selecting the additional current sense resistor 130-1, 130-$n$.

Figure 4:
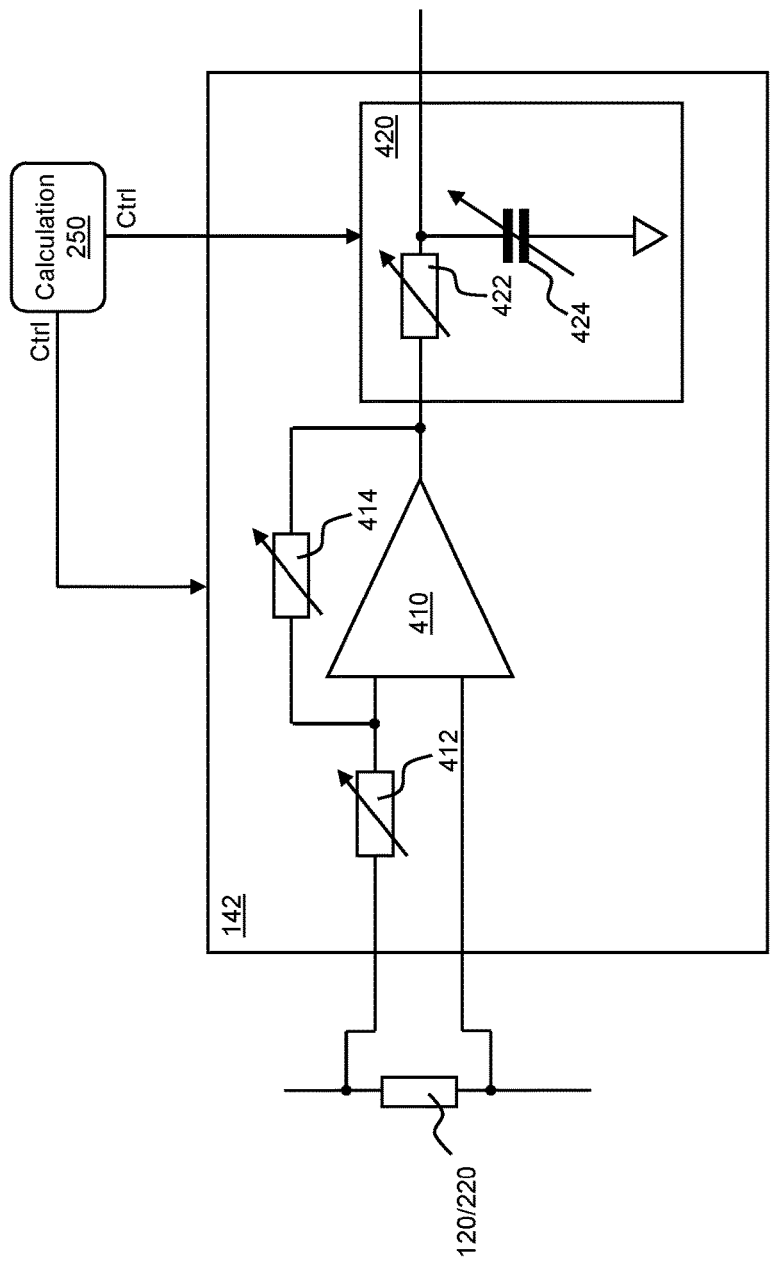
FIG. 4 is a is a schematic diagram illustrating example analog front end (AFE) circuitry for the voltage and/or current monitoring path of the circuitry of FIG. 3.

FIG. 4 is a schematic diagram illustrating example AFE circuitry 142 for the voltage monitoring path 140 of the circuitry 300. The AFE circuitry 172 of the current monitoring path 170 may have the same configuration.

The AFE circuitry 142 in this example comprises amplifier circuitry 410 having first and second inputs configured to be coupled to the load 120 or reference load 220 (depending on the operating mode of the circuitry 300. A feedback arrangement is provided by an input resistor 412 coupled to a first input of the amplifier circuitry 410 and a feedback resistor 414 coupled between an output of the amplifier circuitry 410 and the input resistor 412. As will be appreciated by those of ordinary skill in the art, a gain of the amplifier circuitry 410 is dependent upon a ratio of the resistance of feedback resistor 414 to the resistance of the input resistor 412.

The resistance of the feedback resistor 414 may be variable to permit adjustment of the gain of the amplifier circuitry 414.

For example, the feedback resistor 414 may be implemented by a metal-oxide semiconductor (MOS) device whose drain-source resistance can be adjusted by adjusting a voltage applied to the gate of the MOS device.

Alternatively the feedback resistor 414 may be implemented as a switched resistor arrangement comprising a plurality of switched resistors coupled in parallel, such that the total resistance of the switched resistor arrangement can be controlled by selectively opening and closing switches associated with the individual resistors.

Alternatively or additionally, the resistance of the input resistor 412 may be variable to permit adjustment of the gain of the amplifier circuitry 414. Such a variable input resistor be implemented by a metal-oxide semiconductor (MOS) device or a switched resistor arrangement of the kind described above.

Filter circuitry 420 is coupled to an output of the amplifier circuitry 410. In this example the filter circuitry 420 comprises a resistor 422 having a first terminal coupled to an input of the filter circuitry 420 and a second terminal coupled to an output of the filter circuitry 420, and a capacitor 424 coupled between the second terminal of the resistor 422 and a ground or 0v connection. It will be appreciated, however, that other configurations of filter circuitry could be employed.

As will be appreciated by those of ordinary skill in the art, the frequency and phase response of the filter circuitry 420 are determined by the resistance of the resistor 422 and the capacitance of the capacitor 424. The resistance of the resistor 422 and the capacitance of the capacitor 424 may be variable to permit adjustment of the frequency and phase response of the filter circuitry 420.

For example, the resistor 422 may be implemented by a MOS device or a switched resistor arrangement of the kind described above. The capacitor 424 may be implemented by a switched capacitor arrangement comprising a plurality of switched capacitors coupled in parallel, such that the total capacitance of the switched capacitor arrangement can be controlled by selectively opening and closing switches associated with the individual capacitors.

Additionally or alternatively a transconductance of the amplifier circuitry 410 may be variable so as to adjust the bandwidth of the AFE circuitry 142. Adjusting the bandwidth of the AFE circuitry 142 also changes the position of poles in the phase response of the AFE circuitry 142.

Figure 5:
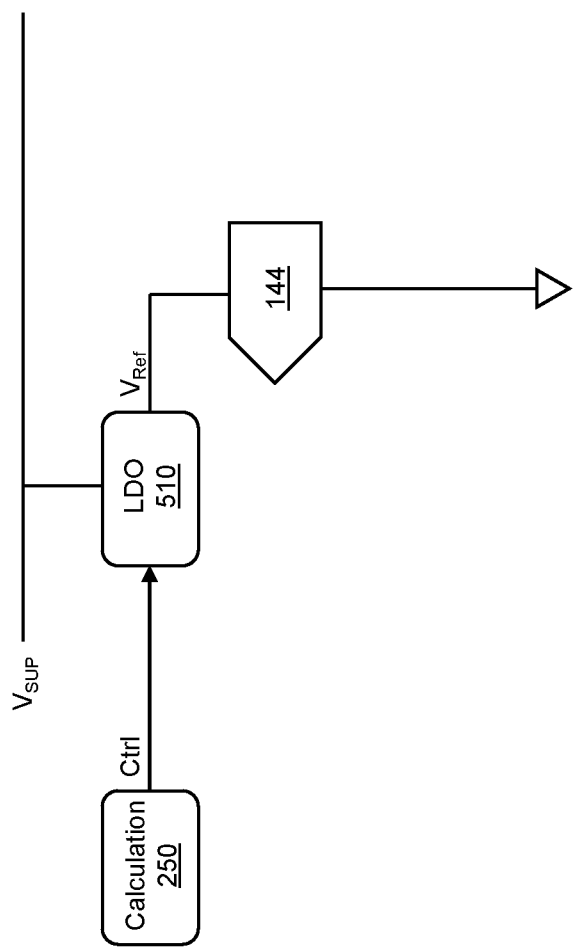
FIG. 5 is a schematic representation of is a schematic diagram illustrating an example analog to digital converter (ADC) arrangement.

FIG. 5 is a schematic diagram illustrating an example ADC arrangement for the ADC circuitry 144 of the voltage monitoring path 140 of the circuitry 300. The ADC circuitry 174 of the current monitoring path 170 may have the same configuration.

As shown in FIG. 5, the ADC circuitry 144 receives a reference voltage $V_{ref}$, which in this example is provided by low dropout regulator (LDO) circuitry 510. By adjusting the reference voltage $V_{ref}$, the gain of the ADC circuitry 144 can be adjusted.

As noted above, the calculation block 250 is configured to determine, based on a difference between the estimated impedance $Z_{est}$ of the reference load 220 and the predefined impedance $Z_{known}$ of the reference load 220, one or more compensation parameters to be applied to analog elements of the voltage monitoring path 130 and/or the current monitoring path 170.

For example, to compensate for any phase mismatch between the voltage monitoring path 140 and the current monitoring path 170, the calculation block 250 may determine a capacitance of the capacitor 424 and/or a resistance of the resistor 422 of the filter circuitry 420 required to move a pole of the phase response of the filter circuitry 420 to compensate for the phase mismatch, and may output appropriate control signals to the filter circuitry 420 to adjust the capacitance of the capacitor 424 and/or the resistance of the resistor 422 accordingly.

Alternatively or additionally, the calculation block 250 may determine a transconductance of the amplifier circuitry 410 of the AFE circuitry 142 required to move a pole of the phase response of the AFE circuitry 142 to compensate for the phase mismatch.

To compensate for any gain mismatch between the voltage monitoring path 140 and the current monitoring path 170, the calculation block 250 may determine a resistance of the feedback resistor 414 and/or a resistance of the input resistor 412 required to adjust the gain of the AFE circuitry 142, and may output appropriate control signals to the AFE circuitry 142 to adjust the resistance of the feedback resistor 414 and/or the input resistor 412 accordingly.

Alternatively or additionally, the calculation block 250 may determine a reference voltage $V_{ref}$ to be applied to the ADC circuitry 144 to adjust the gain of the ADC 144 to compensate for the gain mismatch, and may output appropriate control signals to the LDO circuitry 510 (or other circuitry that supplies the reference voltage $V_{ref}$ to the ADC circuitry 144) to adjust the reference voltage $V_{ref}$ accordingly.

In the discussion above the calculation circuitry 250 is described as determining compensation parameters that are be applied to analog elements of the voltage monitoring path 140, but it will be appreciated by those skilled in the art that the calculation circuitry 250 could, alternatively or additionally, determine compensation parameters that are applied to analog elements of the current monitoring path 170.

In both the digital gain/phase mismatch compensation example described above with reference to FIG. 2 and the analog gain/phase mismatch compensation example described above with reference to FIGS. 3-5, after the compensation parameter(s) have been applied by the calculation circuitry 250, the circuitry 200, 300 may perform a verification cycle to confirm that the applied compensation parameter(s) have achieved the desired compensation effect.

Thus, after determining and applying the compensation parameter(s), the reference signal may again be applied to the reference element 220, and the calculation block 250 may determine an estimated impedance $Z_{est}$ of the reference load 220, based on the signals output by the first and second DFT blocks 232, 242. This estimated impedance $Z_{est}$ is then compared by the calculation block 250 to the predefined impedance $Z_{known}$ of the reference element 220. If the estimated impedance $Z_{est}$ is equal to (or is within a defined tolerance range of) the predefined impedance $Z_{known}$, the compensation parameters that have been applied have achieved the desired compensation effect, and the circuitry 200, 300 can now switch to operation in its load driving mode. On the other hand, if the estimated impedance $Z_{est}$ is not equal to (or is outside a defined tolerance range of) the predefined impedance $Z_{known}$ then a gain or phase mismatch still exists between the voltage monitoring path 140 and the current monitoring path 170, and new compensation parameters may be calculated in the manner described above.

The circuitry 200, 300 may be configured to perform calibration in the manner described above in response to particular trigger events, e.g. on start-up or power on of the circuitry 200, 300 or in response to a change in operating conditions, e.g. a change in ambient temperature, supply voltage or the like. Additionally or alternatively, the circuitry may be configured to perform calibration in the manner described above periodically or in accordance with a predefined schedule.

As will be appreciated from the foregoing disclosure, determining one or more compensation parameters and applying the determined compensation parameter(s) in operation of the circuitry 200, 300 in its load driving mode of operation improves the accuracy of an estimate $Z_{est}$ of the load impedance and the accuracy of any estimate of the resistance and/or inductance of the load 120 generated by the calculation block 250 during operation of the circuitry 200, 300 in its load driving mode, as any gain and/or phase mismatch between the voltage monitoring path 140 and the current monitoring path 170 is compensated for by the application of the compensation parameter(s).

The circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:
1. Circuitry comprising:
a voltage monitoring path;
a current monitoring path;
  a reference element of a predefined impedance; and
  processing circuitry,
wherein in operation of the circuitry in a calibration mode of operation:
  the voltage monitoring path is operative to output a signal indicative of a voltage across the reference element in response to a reference signal applied to the reference element;
  the current monitoring path is operative to output a signal indicative of a current through the reference element in response to the reference signal; and
  the processing circuitry is operative to:
    receive the signal indicative of the voltage across the reference element and the signal indicative of the current through the reference element;
    generate an estimate of an impedance of the reference element; and
    determine a compensation parameter for an element of the circuitry for compensating for a difference between the estimate of the impedance and the predefined impedance of the reference element.

2. The circuitry according to claim 1, wherein the circuitry is configured to apply the compensation parameter in operation of the circuitry in a load driving mode of operation.

3. The circuitry according to claim 1, wherein the compensation parameter is a frequency domain compensation parameter.

4. The circuitry according to claim 3, wherein the processing circuitry comprises:
a first conversion block for converting the signal indicative of the voltage across the reference element into a first frequency domain complex vector; and
a second conversion block for converting the signal indicative of the current through the reference element into a second frequency domain complex vector,
wherein the processing circuitry comprises a calculation block configured to generate the estimate of the impedance of the reference element based on the first and second frequency domain complex vectors and to compare the generated estimate to the predefined impedance of the reference element.

5. The circuitry according to claim 4, wherein the circuitry further comprises a compensation block configured to apply the compensation parameter to the first frequency domain complex vector or the second frequency domain complex vector.

6. The circuitry according to claim 4, wherein the calculation block is configured to calculate a gain mismatch $\beta$ by dividing a ratio of the magnitude of the first complex vector to the magnitude of the second complex vector by the magnitude of the predefined impedance, and to calculate a phase mismatch $\Phi$ by subtracting the phase of a ratio of the first complex vector to the second complex vector from the phase of the predefined impedance.

7. The circuitry according to claim 6, wherein the calculation block is configured to calculate a first compensation coefficient $B_R$ and a second compensation coefficient $B_I$, where:

$$B_R = \frac{1}{\beta}\cos\Phi; \text{ and}$$

$$B_I = -\frac{1}{\beta}\sin\Phi,$$

and wherein the compensation parameter comprises a compensation vector comprising the first and second compensation coefficients.

8. The circuitry according to claim 5, wherein the compensation parameter comprises a compensation vector comprising first and second temperature-dependent compensation coefficients, wherein the calculation block is configured to select the first and second temperature-dependent compensation coefficients based on a detected temperature.

9. The circuitry according to claim 8, wherein the temperature-dependent compensation coefficients comprise predefined polynomials.

10. The circuitry according to claim 1, wherein the compensation parameter is a time domain compensation parameter.

11. The circuitry according to claim 10, wherein the compensation parameter comprises a parameter of an analog element of the voltage monitoring path or the current monitoring path.

12. The circuitry according to claim 11, wherein the voltage monitoring path and the current monitoring path each comprise analog front end (AFE) circuitry and analog to digital converter (ADC) circuitry, and wherein the compensation parameter comprises a parameter of the AFE circuitry or the ADC circuitry.

13. The circuitry according to claim 12, wherein the compensation parameter comprises one or more of:
a resistance of a resistor of filter circuitry of the AFE circuitry of the voltage monitoring path or the current monitoring path;
a capacitance of a capacitor of filter circuitry of the AFE circuitry of the voltage monitoring path or the current monitoring path; and
a transconductance of amplifier circuitry of the AFE circuitry of the voltage monitoring path or the current monitoring path.

14. The circuitry according to claim 12, wherein the compensation parameter comprises one or more of:
a resistance of a resistor of a feedback network of amplifier circuitry of the AFE circuitry of the voltage monitoring path or the current monitoring path; and
a reference voltage for the ADC circuitry of the voltage monitoring path or the current monitoring path.

15. The circuitry according to claim 1, wherein the circuitry is configured to apply the compensation parameter in operation of the circuitry in the compensation mode of operation, wherein the processing circuitry is operative to:
with the compensation parameter applied, generate an estimate of an impedance of the reference element; and
compare the estimate of the impedance and the predefined impedance of the reference element.

16. The circuitry according to claim 1, wherein the reference element comprises a tantalum nitride resistor.

17. The circuitry according to claim 1, further comprising load selector circuitry for selectively coupling the voltage and current monitoring paths to the reference element or to a load according to the mode of operation of the circuitry.

18. The circuitry according to claim 17, wherein the load selector circuitry comprises a controllable switch network.

19. The circuitry according to claim 17, wherein the current monitoring path comprises a plurality of selectable current sense resistors, wherein:
in the calibration mode, the processing circuitry is operative to determine a first compensation parameter with a first one of the plurality selectable current sense resistors selected; and
in a load driving mode of operation of the circuitry, the processing circuitry is operable to:
generate a first estimate of an impedance of a load coupled to the circuitry with the first one of the plurality selectable current sense resistors selected; and
determine a second compensation parameter if a second estimate of the impedance of the load generated by the processing circuitry with a second one of the of the plurality of selectable current sense resistors selected differs from the first estimate of the impedance of the load.

20. An integrated circuit comprising circuitry according to claim 1.

21. A host device comprising circuitry according to claim 1, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

* * * * *

UNITED STATES PATENT AND TRADEMARK OFFICE
CERTIFICATE OF CORRECTION

Page 1 of 2

PATENT NO. : 11,644,521 B1
APPLICATION NO. : 17/690327
DATED : May 9, 2023
INVENTOR(S) : Hellman et al.

It is certified that error appears in the above-identified patent and that said Letters Patent is hereby corrected as shown below:

In the Specification

1. In Column 1, Line 40, delete "pulse width modulator (PWM)" and insert -- pulse width modulation (PWM) --, therefor.

2. In Column 1, Line 41, delete "circuitry" and insert -- circuitry. --, therefor.

3. In Column 4, Line 62, delete "selected" and insert -- selected. --, therefor.

4. In Column 5, Line 3, delete "of the of the" and insert -- of the --, therefor.

5. In Column 5, Line 37, delete "is a is a" and insert -- is a --, therefor.

6. In Column 5, Line 40, delete "of is" and insert -- of --, therefor.

7. In Column 7, Line 9, delete "output a digital signal output a digital signal" and insert -- output a digital signal --, therefor.

8. In Column 7, Lines 20-21, delete "output a digital signal output a digital signal" and insert -- output a digital signal --, therefor.

9. In Column 9, Line 17, delete "α" and insert -- β --, therefor.

10. In Column 9, Line 22, delete "be" and insert -- be: --, therefor.

11. In Column 10, Line 49, delete "retrieved" and insert -- and retrieved --, therefor.

12. In Column 10, Line 55, delete "and or/phase" and insert -- and/or phase --, therefor.

13. In Column 11, Line 55, delete "the the" and insert -- the --, therefor.

Signed and Sealed this
Fifteenth Day of August, 2023

Katherine Kelly Vidal
*Director of the United States Patent and Trademark Office*

CERTIFICATE OF CORRECTION (continued)
U.S. Pat. No. 11,644,521 B1

14. In Column 12, Lines 10-11, delete "(depending" and insert -- depending --, therefor.

15. In Column 13, Line 51, delete "be" and insert -- to be --, therefor.

16. In Column 14, Line 9, delete "operation" and insert -- operate --, therefor.

In the Claims

17. In Column 17, Line 5, in Claim 7, delete "$B_1$," and insert -- $B_I$, --, therefor.

18. In Column 18, Lines 36-37, in Claim 19, delete "of the of the" and insert -- of the --, therefor.